(12) United States Patent
Miura et al.

(10) Patent No.: US 11,693,322 B2
(45) Date of Patent: Jul. 4, 2023

(54) LIQUID PROCESSING APPARATUS, LIQUID PROCESSING METHOD, AND COMPUTER-READABLE RECORDING MEDIUM

(71) Applicant: Tokyo Electron Limited, Tokyo (JP)

(72) Inventors: Takuya Miura, Kumamoto (JP); Shougo Takahashi, Kumamoto (JP); Kouichirou Tanaka, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 17/130,126

(22) Filed: Dec. 22, 2020

(65) Prior Publication Data

US 2021/0191271 A1 Jun. 24, 2021

(30) Foreign Application Priority Data

Dec. 24, 2019 (JP) ................. 2019-233210

(51) Int. Cl.

| | |
|---|---|
| *B08B 3/02* | (2006.01) |
| *G03F 7/42* | (2006.01) |
| *B08B 3/08* | (2006.01) |
| *B08B 13/00* | (2006.01) |
| *B08B 5/02* | (2006.01) |

(52) U.S. Cl.
CPC ............... *G03F 7/422* (2013.01); *B08B 3/02* (2013.01); *B08B 3/08* (2013.01); *B08B 5/02* (2013.01); *B08B 13/00* (2013.01)

(58) Field of Classification Search
CPC . G03F 7/422; G03F 7/30; G03F 7/162; G03F 7/38; G03F 7/3021; B08B 3/02; B08B 3/08; B08B 5/02; B08B 13/00; H01L 21/6715; H01L 21/67034; H01L 21/67051; H01L 21/0273; B05B 1/06

See application file for complete search history.

(56) References Cited

U.S. PATENT DOCUMENTS

| | | | | |
|---|---|---|---|---|
| 2012/0111373 | A1* | 5/2012 | Arima | ............... G03F 7/422 |
| | | | | 134/99.1 |
| 2012/0175819 | A1* | 7/2012 | Miya | ............... H01L 21/02052 |
| | | | | 425/445 |
| 2012/0325274 | A1* | 12/2012 | Kai | ............... H01L 21/67051 |
| | | | | 134/102.1 |

FOREIGN PATENT DOCUMENTS

JP 2004-274028 A 9/2004

* cited by examiner

*Primary Examiner* — Erin F Bergner
(74) *Attorney, Agent, or Firm* — Pearne & Gordon LLP

(57) ABSTRACT

A liquid processing apparatus includes a substrate holder configured to hold a substrate; a processing liquid supply configured to supply a processing liquid onto a front surface of the substrate; a gas supply configured to supply a gas onto the front surface of the substrate; and a controller. The gas supply includes a diffusion nozzle which is provided with multiple discharge openings respectively elongated at different angles with respect to the front surface of the substrate. The controller performs controlling the gas supply to jet the gas from the diffusion nozzle onto a region of the front surface of the substrate including at least a central portion thereof in a state that the processing liquid is supplied on the front surface of the substrate.

19 Claims, 15 Drawing Sheets

LIQUID PROCESSING APPARATUS, LIQUID PROCESSING METHOD, AND COMPUTER-READABLE RECORDING MEDIUM

CROSS-REFERENCE TO RELATED APPLICATION

This application claims the benefit of Japanese Patent Application No. 2019-233210 filed on Dec. 24, 2019, the entire disclosure of which is incorporated herein by reference.

TECHNICAL FIELD

The various aspects and embodiments described herein pertain generally to a liquid processing apparatus, a liquid processing method, and a computer-readable recording medium.

BACKGROUND

Patent Document 1 describes a developing apparatus configured to develop a resist film formed on a surface of a substrate by supplying a developing liquid onto the surface of the substrate. The developing apparatus is equipped with an air blower configured to jet air adjusted to a preset temperature to the substrate from above it; and a temperature controller configured to maintain a chuck device and a developing liquid supply line at a predetermined temperature through circulation of temperature control water which is adjusted to a preset temperature.

Patent Document 1: Japanese Patent Laid-open Publication No. 2004-274028

SUMMARY

In one exemplary embodiment, a liquid processing apparatus includes a substrate holder configured to hold a substrate; a processing liquid supply configured to supply a processing liquid onto a front surface of the substrate; a gas supply configured to supply a gas onto the front surface of the substrate; and a controller. The gas supply includes a diffusion nozzle which is provided with multiple discharge openings respectively elongated at different angles with respect to the front surface of the substrate. The controller performs controlling the gas supply to jet the gas from the diffusion nozzle onto a region of the front surface of the substrate including at least a central portion thereof in a state that the processing liquid is supplied on the front surface of the substrate.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

FIG. 13A shows an in-surface line width distribution of an experimental example 1, and FIG. 13B shows an in-surface line width distribution of an experimental example 2;

FIG. 14A shows an in-surface line width distribution of an experimental example 3, and FIG. 14B shows an in-surface line width distribution of a comparative example.

DETAILED DESCRIPTION

Figure 1:
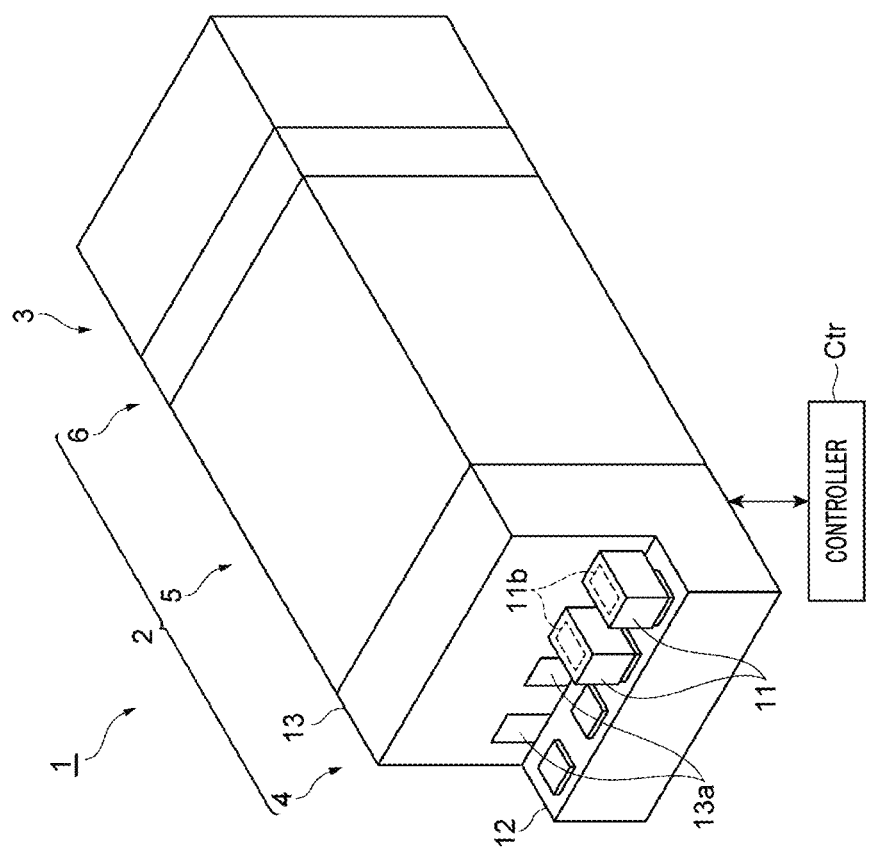
FIG. 1 is a perspective view illustrating an example of a substrate processing system.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

In the following description, same parts or parts having same functions will be assigned same reference numerals, and redundant description thereof will be omitted.

[Substrate Processing System]

First, a configuration of a substrate processing system 1 will be explained with reference to FIG. 1 to FIG. 3. The substrate processing system 1 includes a coating and developing apparatus 2 (liquid processing apparatus), an exposure apparatus 3, and a controller Ctr (control unit).

The exposure apparatus 3 is configured to send and receive a substrate W to/from the coating and developing apparatus 2 and perform an exposure processing (pattern exposure) of a resist film R formed on a front surface Wa (see FIG. 4, etc.) of a substrate W. The exposure apparatus 3 may irradiate an energy beam to an exposure target portion of the resist film R selectively by, for example, an immersion exposure method or the like.

The energy beam may be, by way of non-limiting example, an ionizing radiation or a non-ionizing radiation. The ionizing radiation is a radioactive ray having enough energy to ionize an atom or a molecule. The ionizing radiation may be, by way of non-limiting example, an EUV (Extreme Ultraviolet), an electronic beam, an ion beam, an X-ray, an α-ray, a β-ray, a γ-ray, a baryon beam, a proton beam, or the like. The non-ionizing radiation is a radioactive ray which does not have enough energy to ionize an atom or a molecule. The non-ionizing radiation may be, by way of non-limiting example, a g-ray, an i-ray, a KrF excimer laser, an ArF excimer laser, a $F_2$ excimer laser, or the like.

The coating and developing apparatus 2 is configured to form the resist film R on the front surface Wa of the substrate W prior to the exposure processing by the exposure apparatus 3. The coating and developing apparatus 2 is also configured to perform a developing processing for the resist film R after the exposure processing.

The substrate W may have a circular plate shape, or may have a plate shape other than the circular shape, such as a polygonal shape. The substrate W may have a notched portion where a part of the substrate W is notched. The notched portion may be, by way of example, a notch (a U-shaped or V-shaped groove, or the like), or may be a straight line-shaped portion (a so-called orientation flat) extending in a straight line shape. The substrate W may be, by way of non-limiting example, a semiconductor substrate (silicon wafer), a glass substrate, a mask substrate, a FPD (Flat Panel Display) substrate, or any of various other types of substrates. The substrate W may have a diameter ranging from, e.g., about 200 mm to about 450 mm.

Figure 2:
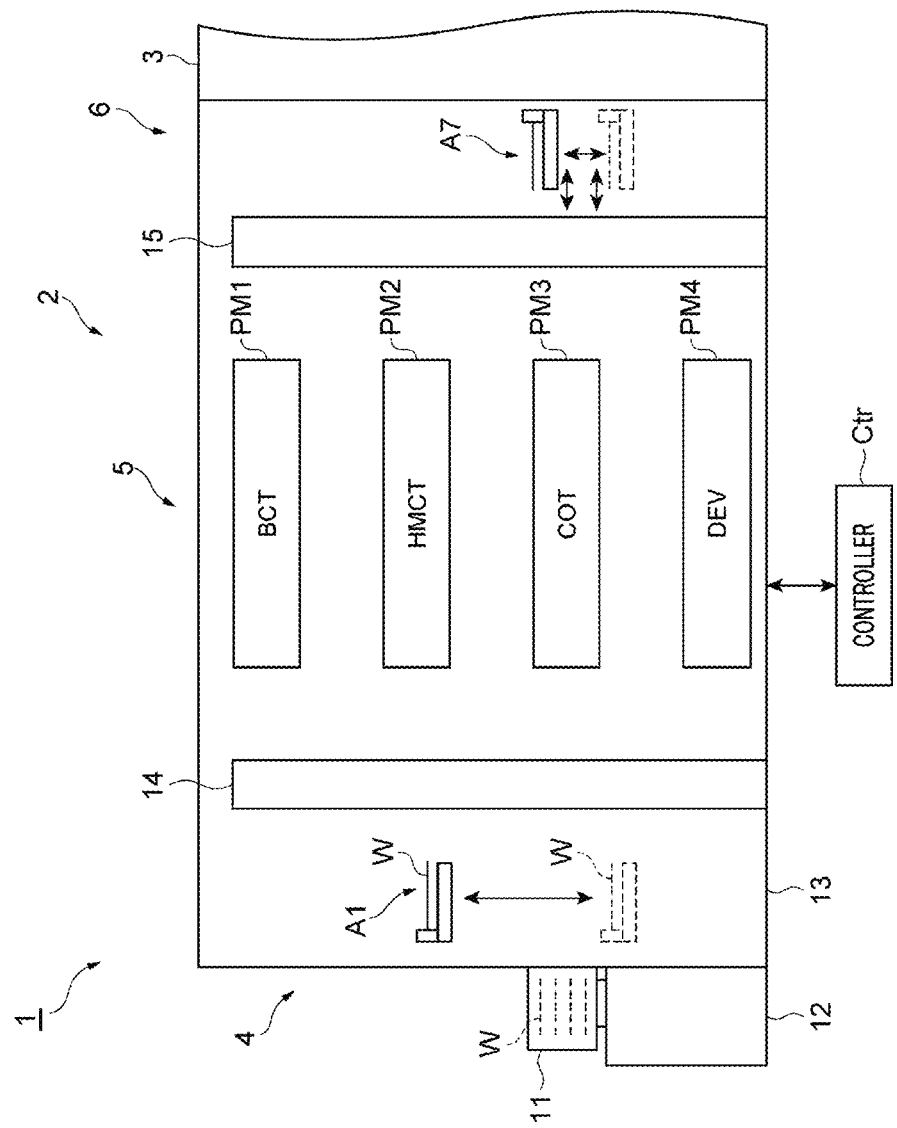
FIG. 2 is a side view schematically illustrating an inside of the substrate processing system of FIG. 1.
Figure 3:
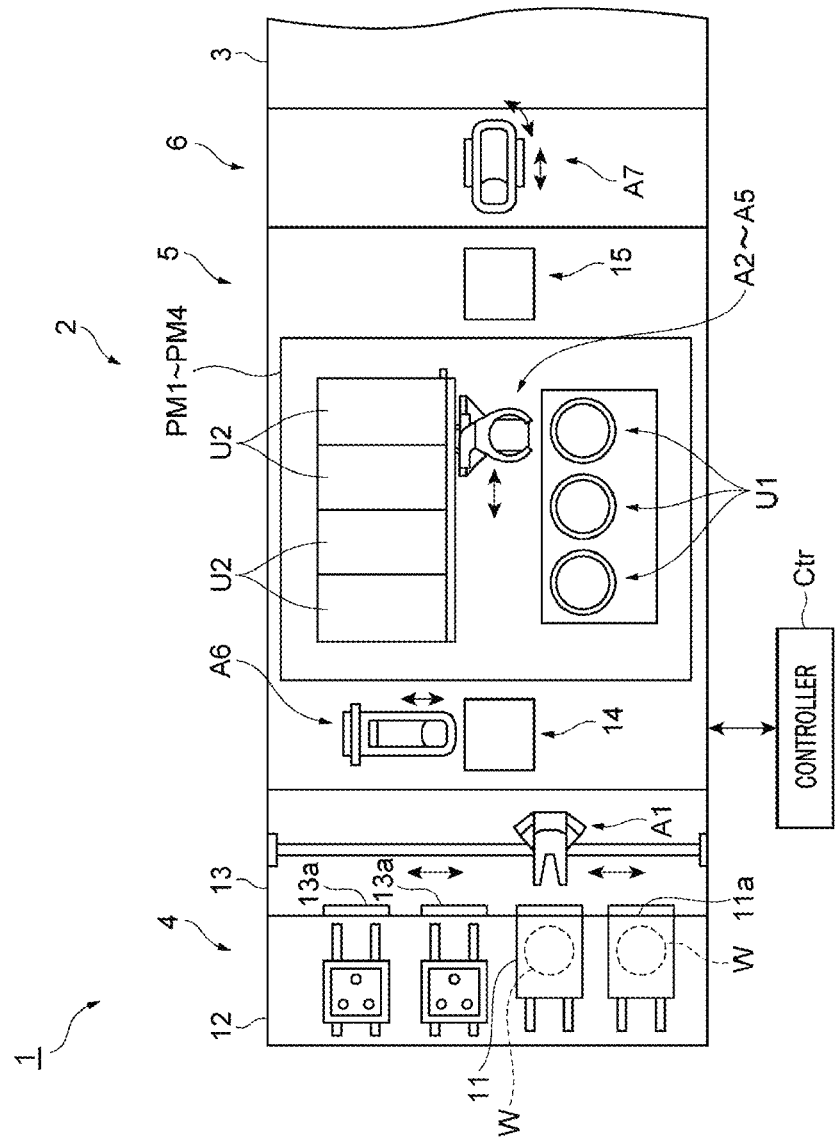
FIG. 3 is a top view schematically illustrating the inside of the substrate processing system of FIG. 1.

As depicted in FIG. 1 to FIG. 3, the coating and developing apparatus 2 is equipped with a carrier block 4, a processing block 5, and an interface block 6. The carrier block 4, the processing block 5 and the interface block 6 are arranged in a horizontal direction.

The carrier block 4 is equipped with a carrier station 12 and a carry-in/out section 13. The carrier station 12 supports a plurality of carriers 11. Each of the carriers 11 accommodates therein at least one substrate W in a sealed state. An opening/closing door (not illustrated) through which the substrate W is carried in/out is provided at a side surface 11a of the carrier 11. The carrier 11 is detachably disposed on the carrier station 12 such that the side surface 11a faces the carry-in/out section 13.

The carry-in/out section 13 is located between the carrier station 12 and the processing block 5. As depicted in FIG. 1 and FIG. 3, the carry-in/out section 13 includes a plurality of opening/closing doors 13a. When the carrier 11 is placed on the carrier station 12, the opening/closing door of the carrier 11 directly faces one of the opening/closing door 13a. By opening the opening/closing door 13a and the opening/closing door on the side surface 11a at the same time, the inside of the carrier 11 communicates with the inside of the carry-in/out section 13. As shown in FIG. 2 and FIG. 3, the carry-in/out section 13 incorporates a delivery arm A1. The delivery arm A1 is configured to take out the substrate W from the carrier 11 and hand it over to the processing block 5, and is also configured to receive the substrate W from the processing block 5 and return it back into the carrier 11.

The processing block 5 includes, as depicted in FIG. 2 and FIG. 3, processing modules PM1 to PM4.

The processing module PM1 is configured to form a bottom film on the surface of the substrate W, and is also called a BCT module. As illustrated in FIG. 3, the processing module PM1 includes liquid processing units U1, heat treatment units U2, and a transfer arm A2 configured to transfer the substrate W to these units U1 and U2. For example, each of the liquid processing units U1 of the processing module PM1 may be configured to coat the substrate W with a coating liquid for forming the bottom film. As an example, each of the heat treatment units U2 of the processing module PM1 may be configured to perform a heating processing for hardening a coating film formed on the substrate W by the liquid processing unit U1 to use this coating film as the bottom film. The bottom film may be, by way of example, an anti reflection (SiARC) film.

The processing module PM2 is configured to form an intermediate film (hard mask) on the bottom film, and is also called a HMCT module. The processing module PM2 includes liquid processing units U1, heat treatment units U2, and a transfer arm A3 configured to transfer the substrate W to these units U1 and U2. By way of example, each liquid processing unit U1 of the processing module PM2 is configured to coat the substrate W with a coating liquid for forming the intermediate film. For example, each heat treatment unit U2 of the processing module PM2 is configured to perform a heating processing for hardening a coating film formed on the substrate W by the liquid processing unit U1 to use this coating film as the intermediate film. The intermediate film may be, by way of example, but not limitation, a SOC (Spin On Carbon) film, an amorphous carbon film, or the like.

The processing module PM3 is configured to form a thermosetting and photosensitive resist film R on the intermediate film, and is also called a COT module. The processing module PM3 includes liquid processing units U1, heat treatment units U2, and a transfer arm A4 configured to transfer the substrate W to these units U1 and U2. By way of example, each liquid processing unit U1 of the processing module PM3 is configured to coat the substrate W with a coating liquid (resist liquid) for forming the resist film. For example, each heat treatment unit U2 of the processing module PM3 is configured to perform a heating processing (PAB: Pre-Applied Bake) for hardening a coating film formed on the substrate W by the liquid processing unit U1 to use this coating film as the resist film R.

A resist material contained in the resist liquid may have a positive type resist material or a negative type resist material. The positive type resist material is a type of a resist material in which a portion exposed to light becomes soluble whereas an unexposed portion (blocked portion) remains insoluble. The negative type resist material is a type of a resist material in which a portion exposed to light remains insoluble whereas an unexpected portion (blocked portion) becomes soluble.

The processing module PM4 is configured to perform a developing processing on the exposed resist film, and is also called a DEV module. The processing module PM4 includes liquid processing units U1, heat treatment units U2, and a transfer arm A5 configured to transfer the substrate W to these units U1 and U2. By way of example, each liquid processing unit U1 of the processing module PM4 is configured to form a resist pattern (not shown) by partially removing the resist film R. Each heat treatment unit U2 of the processing module PM4 is configured to perform a heating processing before developing processing (PEB: Post Exposure Bake), a heating processing after developing processing (PB: Post Bake), and so forth.

The processing block 5 includes, as depicted in FIG. 2 and FIG. 3, a shelf unit 14 located near the carrier block 4. The shelf unit 14 extends in a vertical direction and includes a plurality of cells arranged in the vertical direction. A transfer arm A6 is provided near the shelf unit 14. The transfer arm A6 is configured to move the substrate W up and down between the cells of the shelf unit 14.

The processing block 5 further includes a shelf unit 15 located near the interface block 6. The shelf unit 15 extends in the vertical direction, and includes a plurality of cells arranged in the vertical direction.

The interface block 6 incorporates a transfer arm A7, and is connected to the exposure apparatus 3. The transfer arm A7 is configured to take out the substrate W from the shelf unit 15 and deliver it to the exposure apparatus 3, and, also, to receive the substrate W from the exposure apparatus 3 and return it into the shelf unit 15.

The controller Ctr is configured to control the coating and developing apparatus 2 partially or in overall. Details of the controller Ctr will be elaborated later. The controller Ctr may be configured to transceive signals to/from a controller of the exposure apparatus 3 and control the substrate processing system 1 in overall in cooperation with the controller of the exposure apparatus 3.

[Liquid Processing Unit]

Figure 4:
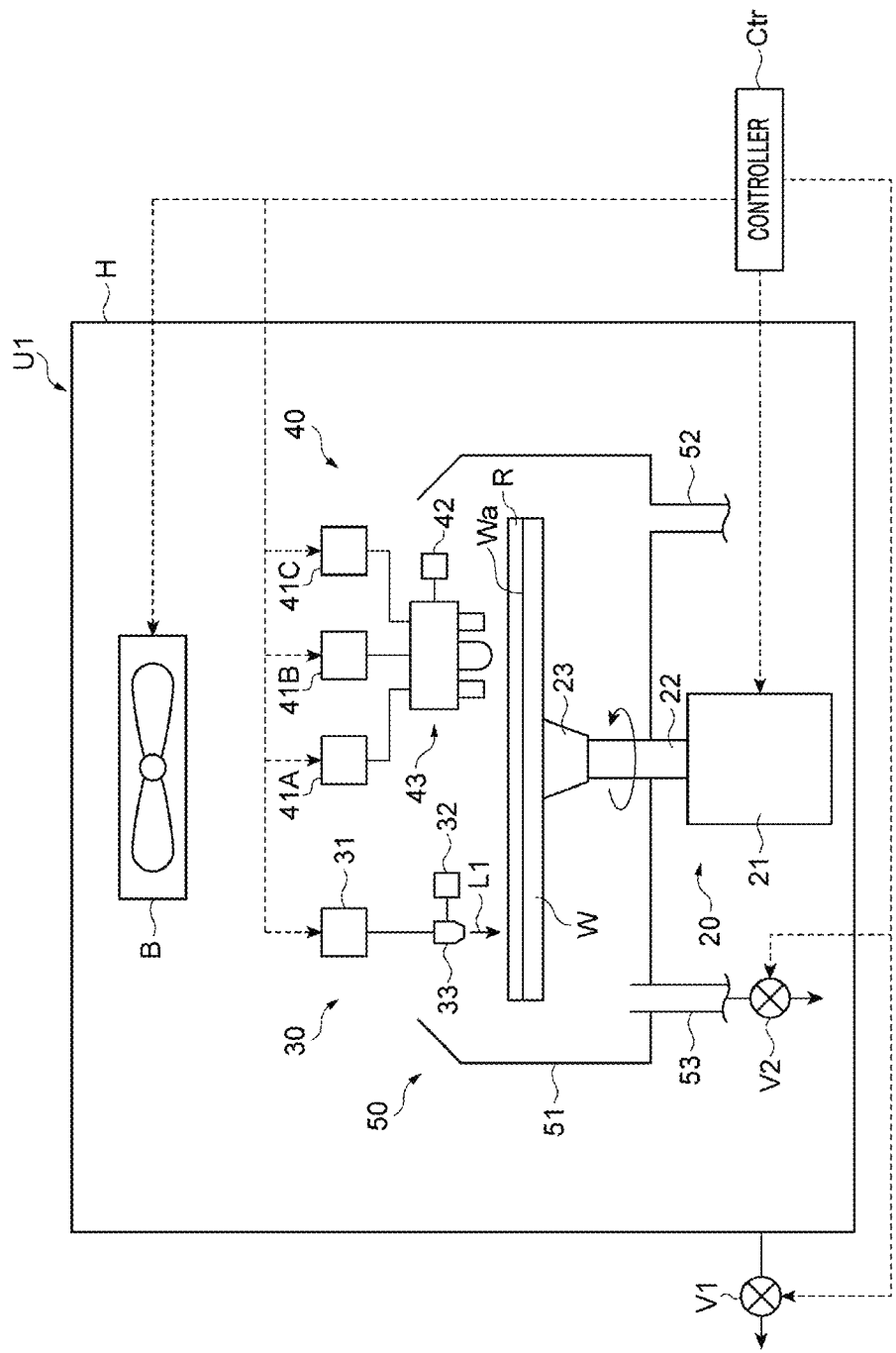
FIG. 4 is a side view schematically illustrating an example of a liquid processing unit.

Now, referring to FIG. 4 and FIG. 5, the liquid processing unit U1 (liquid processing apparatus) of the processing module PM4 will be described in further detail. As depicted in FIG. 4, the liquid processing unit U1 includes, within a housing H, a substrate holder 20, a supply 30 (a processing liquid supply), a supply 40 (a gas supply, a cleaning liquid supply, and a drying gas supply), a cover member 50, and a blower B. An exhaust device V1 configured to exhaust a gas within the housing H by being operated in response to a signal from the controller Ctr is provided in a lower portion of the housing H. The exhaust device V1 may be, by way of non-limiting example, a damper capable of adjusting an exhaust amount depending on a degree of openness. By adjusting the exhaust amount from the housing H by the exhaust device V1, a temperature, a pressure and a humidity within the housing H, and the like can be controlled. The exhaust device V1 may be controlled to evacuate an inside of the housing H constantly during a liquid processing of the substrate W.

The substrate holder 20 includes a rotator 21, a shaft 22 and a holder 23. The rotator 21 is operated based on an operation signal from the controller Ctr and is configured to rotate the shaft 22. The rotator 21 may be, by way of example, but not limitation, a power source such as an electric motor. The holder 23 is provided on a leading end of the shaft 22. The substrate W is placed on the holder 23. The holder 23 is configured to hold the substrate W substantially horizontally by, for example, suction. That is, the substrate holder 20 rotates the substrate W around a central axis (rotation axis), which is perpendicular to the front surface Wa of the substrate W, while holding the substrate W in a substantially horizontal posture.

The supply 30 is configured to supply a processing liquid L1 onto the front surface Wa of the substrate W. The processing liquid L1 may be, for example, a developing liquid.

The supply 30 includes a supply device 31, a driving device 32 and a nozzle 33. The supply device 31 is configured to send the processing liquid L1 stored in a receptacle (not shown) by a feeding device (not shown) such as a pump based on a signal from the controller Ctr. The driving device 32 is configured to move the nozzle 33 in a height direction and a horizontal direction based on a signal from the controller Ctr. The nozzle 33 is configured to discharge the processing liquid L1 supplied from the supply device 31 onto the front surface Wa of the substrate W.

The supply 40 is configured to supply a processing liquid L2, a cooling gas G1 (gas), and a drying gas G2 onto the front surface Wa of the substrate W. The processing liquid L2 may be, by way of non-limiting example, a rinse liquid (cleaning liquid). The cooling gas G1 and the drying gas G2 are not particularly limited. By way of example, the cooling gas G1 and the drying gas G2 may be an inert gas (for example, nitrogen). The cooling gas G1 and the drying gas G2 may have a temperature ranging from about 20° C. to about 25° C.

The supply 40 includes supply devices 41A to 41C, a driving device 42, and a nozzle unit 43. The supply device 41A is configured to send the processing liquid L2 stored in a receptacle (not shown) by a feeding device (not shown) such as a pump based on a signal from the controller Ctr, as shown in FIG. 4 and FIG. 5. The supply device 41B is configured to send the cooling gas G1 stored in a receptacle (not shown) by a feeding device (not shown) such as a pump based on a signal from the controller Ctr. The supply device 41C is configured to send the drying gas G2 stored in a receptacle (not shown) by a feeding device (not shown) such as a pump based on a signal from the controller Ctr. The driving device 42 is configured to move the nozzle unit 43 in the height direction and the horizontal direction based on a signal from the controller Ctr.

The nozzle unit 43 is configured to discharge the processing liquid L2, the cooling gas G1 and the drying gas G2 respectively supplied from the supply devices 41A to 41C onto the front surface Wa of the substrate W. The nozzle unit 43 includes, as depicted in FIG. 5, a nozzle head 43a and nozzles 43b to 43d. The nozzle head 43a is configured to hold the nozzles 43b to 43d as a single body.

The nozzle 43b is in fluid communication with the receptacle of the supply device 41A. The nozzle 43b is configured to discharge the processing liquid L2 from the supply device 41A onto the front surface Wa of the substrate W.

The nozzle 43c (diffusion nozzle) is in fluid communication with the receptacle of the supply device 41B. The nozzle 43c is configured to jet the cooling gas G1 from the supply device 41B onto the front surface Wa of the substrate W. Multiple discharge openings are formed in a leading end portion (lower end portion) of the nozzle 43c, and these multiple discharge openings are elongated at different angles with respect to the front surface Wa of the substrate W. Thus, as the cooling gas G1 jetted from the nozzle 43c gets distanced away from the leading end portion of the nozzle 43c, the cooling gas G1 is diffused in a direction (horizontal direction) perpendicular to a lengthwise direction of the nozzle 43c. The multiple discharge openings may be elongated in a radial shape. The leading end portion of the nozzle 43c may have a hemispherical shape, as shown in FIG. 5. The nozzle 43c may be disposed between the nozzle 43b and the nozzle 43d, as illustrated in FIG. 5, or may be disposed at a side position among the three nozzles 43b to 43d. Alternatively, the nozzles 43b to 43d may be arranged to form a circular shape.

The nozzle 43d is in fluid communication with the receptacle of the supply device 41C. The nozzle 43d is configured to jet the drying gas G2 from the supply device 41C onto the front surface Wa of the substrate W.

The cover member 50 is disposed around the substrate holder 20, as shown in FIG. 4. The cover member 50 includes a cup main body 51, a drain port 52, and an exhaust port 53. The cup main body 51 is configured as a liquid collecting receptacle which receives the processing liquids L1 and L2 supplied onto the substrate W for the processing of the substrate W. The drain port 52 is provided at a bottom of the cup main body 51, and a drain liquid collected by the cup main body 51 is drained to an outside of the liquid processing unit U1 through this drain port 52.

The exhaust port 53 is provided at the bottom of the cup main body 51. The exhaust device V2 configured to exhaust a gas within the cup main body 51 by being operated based on a signal from the controller Ctr is provided in this exhaust port 53. Accordingly, a descending flow (downflow) is exhausted to the outside of the liquid processing unit U1 through the exhaust port 53 and the exhaust device V2 after it flows around the substrate W. The exhaust device V2 may be, by way of example, a damper which is capable of adjusting an exhaust amount depending on a degree of openness. By adjusting the exhaust amount from the cup main body 51 by the exhaust device V2, a temperature, a pressure and a humidity within the cup main body 51, and the like can be controlled.

The blower B is disposed above the substrate holder 20 and the cover member 50 within the liquid processing unit U1. The blower B is configured to create, in response to a signal from the controller Ctr, a descending flow heading toward the cover member 50. The blower B may be controlled to create the descending flow constantly during the liquid processing of the substrate W.

[Details of Controller]

Figure 6:
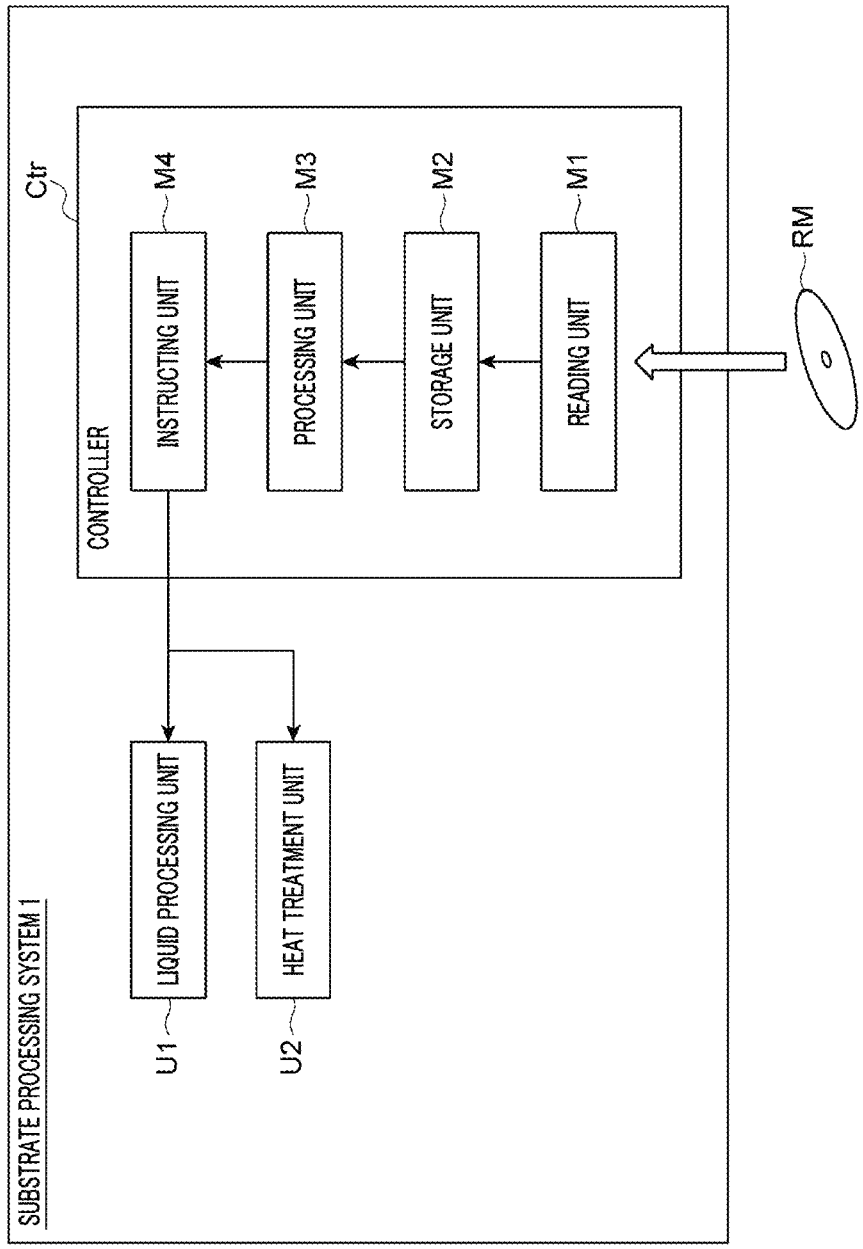
FIG. 6 is a block diagram illustrating an example of a controller.

The controller Ctr includes, as functional modules, a reading unit M1, a storage unit M2, a processing unit M3, and an instructing unit M4, as depicted in FIG. 6. These functional modules are nothing more than divisions of functions of the controller Ctr for convenience's sake, and it does not necessarily imply that hardware constituting the controller Ctr is divided into these modules. Each functional module is not limited to being implemented by execution of a program but may be implemented by a dedicated electric circuit (for example, a logic circuit) or an ASIC (Application Specific Integrated Circuit) as an integration of these electric circuits.

The reading unit M1 is configured to read a program from a computer-readable recording medium RM. The recording medium RM stores thereon a program for operating the individual components of the coating and developing apparatus 2. The recording medium RM may be, by way of example, but not limitation, a semiconductor memory, an optical recording disk, a magnetic recording disk, a magneto-optical recording disk, or the like.

The storage unit M2 stores therein various types of data. The storage unit M2 may store therein, for example, the program read out from the recording medium RM by the reading unit M1, setting data inputted from an operator through an external input device (not shown), and so forth. The program may operate the individual components of the coating and developing apparatus 2 when executed. The recording medium RM may be, by way of non-limiting example, a semiconductor memory, an optical recording disk, a magnetic recording disk, a magneto-optical recording disk, or the like.

The processing unit M3 is configured to process various types of data. By way of example, the processing unit M3 may generate signals for operating the liquid processing unit U1, the heat treatment unit U2, and so forth based on the various types of data stored in the storage unit M2.

The instructing unit M4 is configured to send the signals generated by the processing unit M3 to the various devices.

Figure 7:
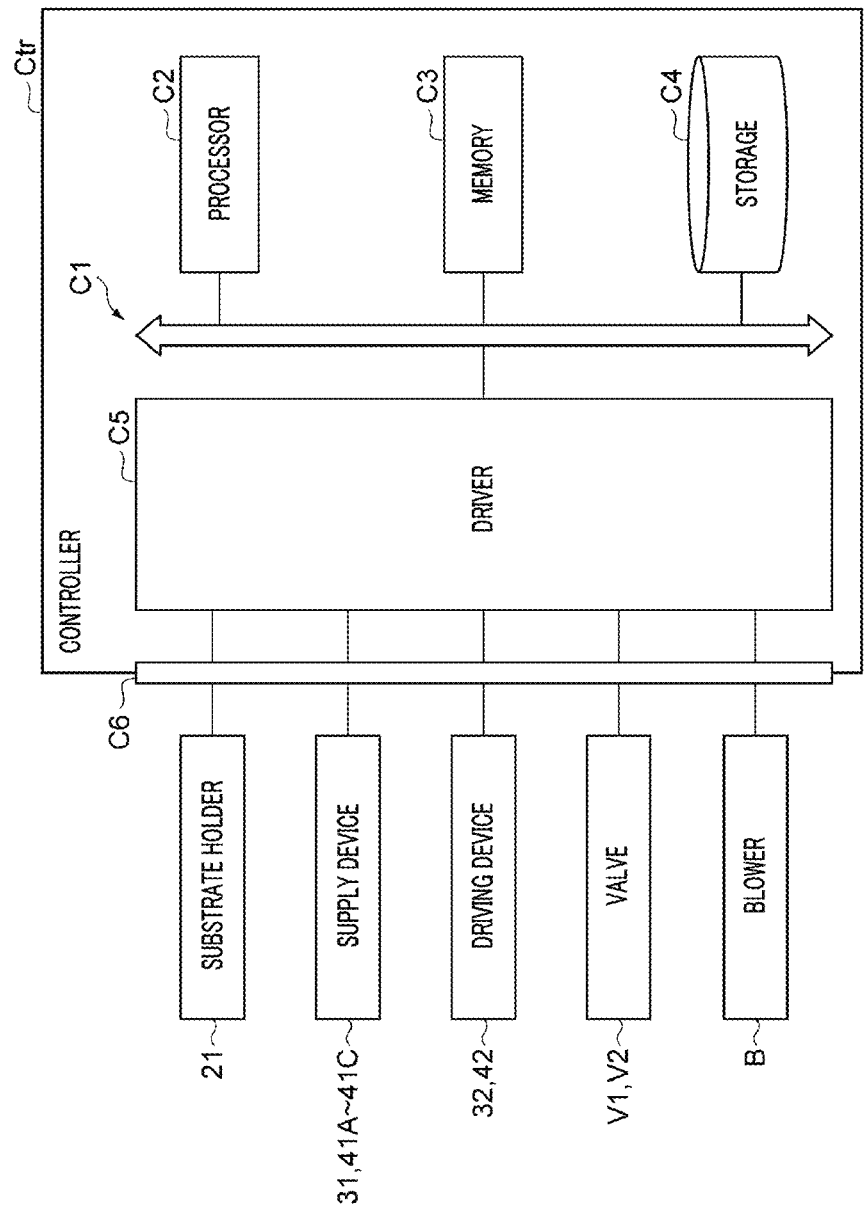
FIG. 7 is a schematic diagram illustrating an example of a hardware configuration of a controller.

The hardware of the controller Ctr may be composed of, by way of example, a single or a plurality of control computers. The controller Ctr includes, as a hardware component, a circuit C1, as shown in FIG. 7. The circuit C1 may be composed of electric circuit elements (circuitry). The circuit C1 may include a processor C2, a memory C3, a storage C4, a driver C5, an input/output port C6.

The processor C2 constitutes the aforementioned individual functional modules by executing the program in cooperation with at least one of the memory C3 and the storage C4 and performing an input/output of signals via the input/output port C6. The memory C3 and the storage C4 serve as the storage unit M2. The driver C5 is a circuit configured to drive the various kinds of devices of the coating and developing apparatus 2. The input/output port C6 performs an input/output of signals between the driver C5 and the various kinds of devices of the coating and developing apparatus 2 (for example, the liquid processing unit U1, the heat treatment unit U2, etc.).

The substrate processing system 1 may be equipped with one controller Ctr or a controller group (control unit) composed of a multiple number of controllers Ctr. When the substrate processing system 1 is equipped with the controller group, each of the aforementioned functional modules may be implemented by a single controller Ctr or a combination of two or more controllers Ctr. If the controller Ctr is composed of a plurality of computers (circuits C1), each of the aforementioned functional modules may be implemented by a single computer (circuit C1) or a combination of two or more computers (circuits C1). The controller Ctr may include a plurality of processors C2. In this case, each of the aforementioned functional modules may be implemented by a single processor C2 or a combination of two or more processors C2.

[Liquid Processing Method for Substrate]

Now, referring to FIG. 8 to FIG. 10B, a liquid processing method for the substrate W will be elaborated.

First, the controller Ctr controls the individual components of the coating and developing apparatus 2 to process the substrate W in the processing modules PM1 to PM3. Accordingly, the resist film R is formed on the front surface Wa of the substrate W (see a process S11 of FIG. 8). Then, the controller Ctr controls the individual components of the coating and developing apparatus 2 to transfer the substrate W from the processing module PM3 to the exposure apparatus 3. Thereafter, the controller different from the controller Ctr controls the exposure apparatus 3 to expose the resist film R formed on the front surface Wa of the substrate W to have a preset pattern (see a process S12 of FIG. 8).

Subsequently, the controller Ctr controls the individual components of the coating and developing apparatus 2 to transfer the substrate W from the exposure apparatus 3 into the liquid processing unit U1 of the processing module PM4. Accordingly, the substrate W is held by the substrate holder 20. Then, the controller Ctr controls the supply 30 to supply the processing liquid L1 (developing liquid) onto the front surface Wa of the substrate W, that is, onto a top surface of the resist film R (see a process S13 of FIG. 8).

Figure 9A:
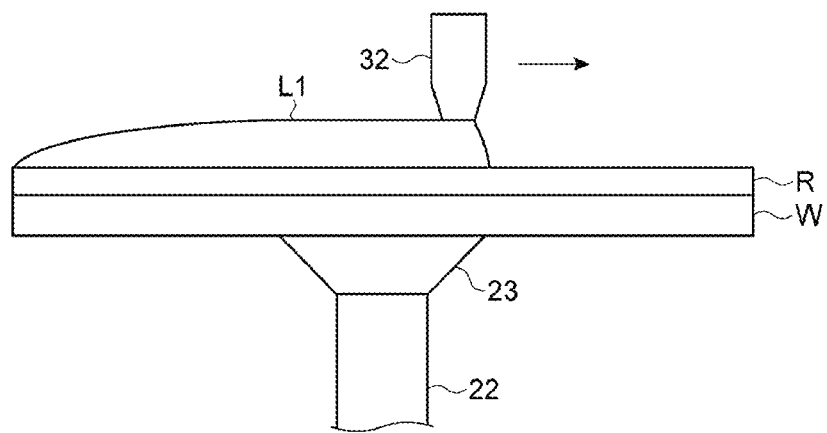
FIG. 9A and FIG. 9B are diagrams for describing a liquid processing method for the substrate.

In the process S13, the controller Ctr may control the supply 30 to supply the processing liquid L1 onto the front surface Wa of the substrate W from the nozzle 33 while moving the nozzle 33 horizontally above the substrate W which is not being rotated. In this case, as shown in FIG. 9A, the processing liquid L1 is supplied from one end of the substrate W to the other end thereof in sequence. Alternatively, the controller Ctr may control the substrate holder 20 and the supply 30 to supply the processing liquid L1 onto the front surface Wa of the substrate W from the nozzle 33 while rotating the substrate W and moving the nozzle 33 horizontally above the substrate W. In this case, the processing liquid L1 is supplied from a center of the substrate W to a periphery thereof or from the periphery of the substrate W toward the center thereof in a spiral shape.

Figure 8:
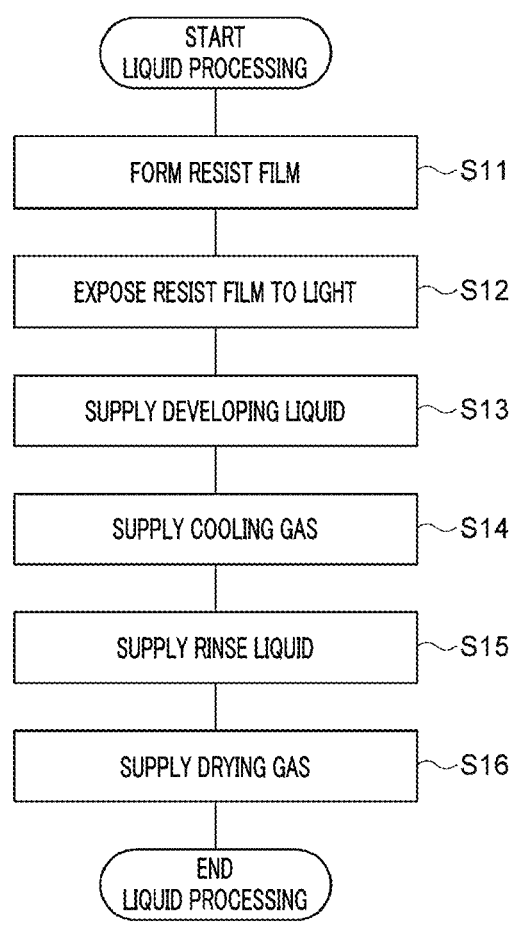
FIG. 8 is a flowchart for describing an example of a sequence of a liquid processing for a substrate.
Figure 9B:
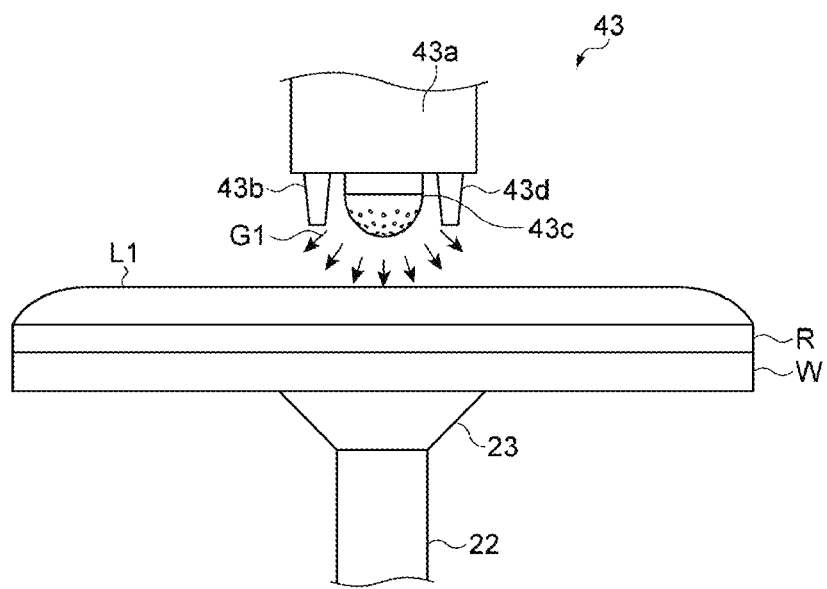

Then, the controller Ctr controls the supply 40 to supply the cooling gas G1 onto the front surface Wa of the substrate W, that is, onto a top surface of the processing liquid L1 from the nozzle 43c (see a process S14 of FIG. 8). In the process S14, the cooling gas G1 is jetted toward a region of the front surface Wa of the substrate W containing at least a central portion thereof, as shown in FIG. 9B. At this time, the processing liquid L1 on the front surface Wa of the substrate W may not be blown by the cooling gas G1. That is, the front surface Wa of the substrate W in the state that the processing liquid L1 is supplied thereon may not be exposed by the jet of the cooling gas G1.

The jetting of the cooling gas G1 onto the processing liquid L1 may be continued during a developing period for the resist film R. By way of example, the jetting of the cooling gas G1 onto the processing liquid L1 may be continued until a developing processing is ended or a subsequent processing is begun after the processing liquid L1 is supplied onto the front surface Wa of the substrate W. In the process S14, the controller Ctr may carry out the supply of the cooling gas G1 onto the front surface Wa of the substrate W in the state that a gas exhaust from the cup main body 51 is stopped or the gas exhaust from the cup main body 51 is carried on by controlling the exhaust device V2.

Figure 10A:
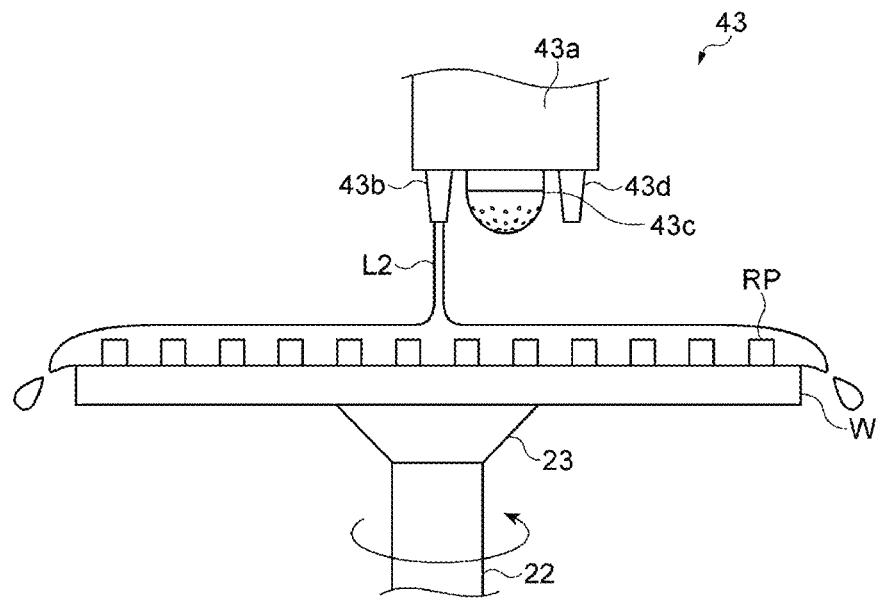
FIG. 10A and FIG. 10B are diagrams for describing the liquid processing method for the substrate.

Subsequently, the controller Ctr controls the substrate holder 20 and the supply 40 to supply the processing liquid L2 (rinse liquid) onto the front surface Wa of the substrate W being rotated, that is, onto the top surface of the processing liquid L1 from the nozzle 43b (see a process S15 of FIG. 8). Accordingly, as depicted in FIG. 10A, a dissolved material of the resist film R dissolved by a reaction with the processing liquid L1 is washed away (drained) from the front surface Wa of the substrate W by the processing liquid L2 along with the processing liquid L1. As a result, a resist pattern RP is formed on the front surface Wa of the substrate W.

In the process S15, the controller Ctr controls the supply 40 to move the nozzle 43b horizontally so that the nozzle 43b is moved above the substrate W from the center toward the periphery thereof. In the process S15, the controller Ctr may carry out the supply of the processing liquid L2 onto the front surface Wa of the substrate W in the state that the gas exhaust from the cup main body 51 is continued by controlling the exhaust device V2. An exhaust amount from the cup main body 51 in the process S15 may be set to be larger than an exhaust amount from the cup main body 51 in the process S14.

Afterwards, when the nozzle 43d reaches a substantially center of the substrate W, the controller Ctr controls the substrate holder 20 and the supply 40 to supply the drying gas G2 from the nozzle 43d onto the front surface Wa of the substrate W being rotated (see a process S16 of FIG. 8).

Figure 5:
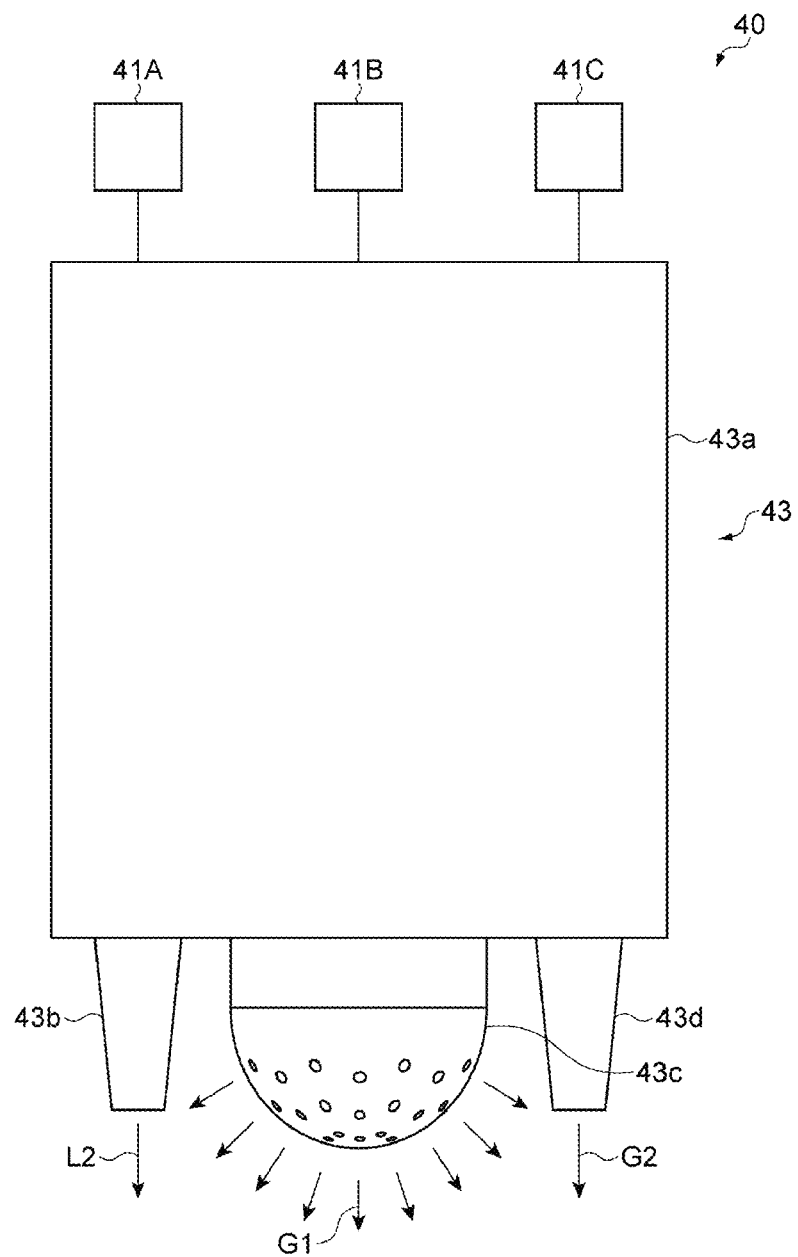
FIG. 5 is a side view illustrating an example of a nozzle unit.
Figure 10B:
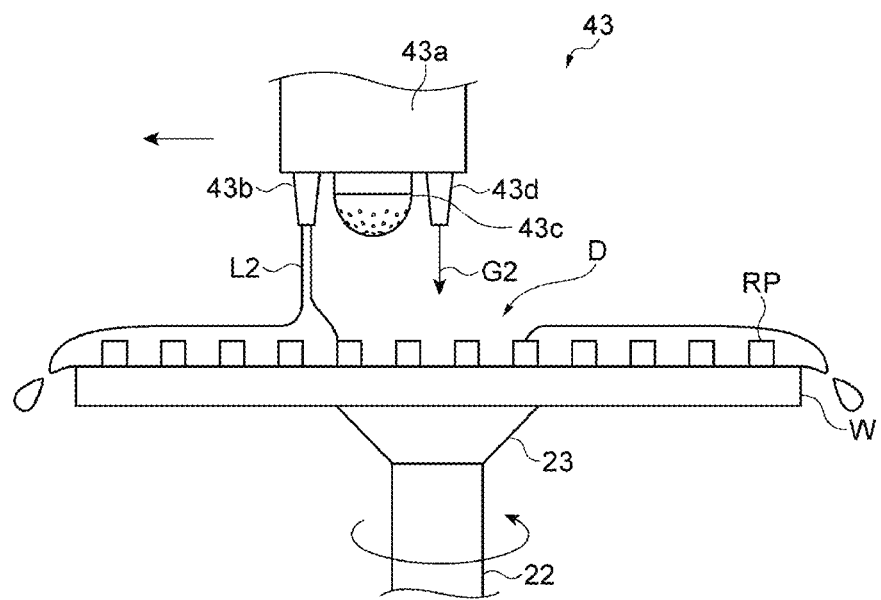

Accordingly, the processing liquid L2 existing at the substantially center of the substrate W is blown around and evaporated, so that a drying region D is formed at the central portion of the substrate W, as illustrated in FIG. 10B (see FIG. 5 and FIG. 8). Here, the drying region D is a region where the front surface Wa of the substrate W is exposed due to the evaporation of the processing liquid L2, and this state may also include a case where a slight amount (for example, a micro-order) of liquid droplet is attached on the front surface Wa. This drying region D is diffused from the central portion of the substrate W toward the periphery thereof by a centrifugal force which is generated when the substrate W is rotated. After the drying region D is formed, the supply of the drying gas G2 from the nozzle 43d may be stopped.

In the process S16, the drying gas G2 may be supplied from the nozzle 43d while the supply of the processing liquid L2 from the nozzle 43b is being carried on. In the process S16, the controller Ctr may perform the supply of the drying gas G2 onto the front surface Wa of the substrate W in the state that the gas exhaust from the cup main body 51 is continued by controlling the exhaust device V2. An exhaust amount from the cup main body 51 in the process S16 may be set to be larger than the exhaust amount from the cup main body 51 in the process S14.

Meanwhile, the processing liquid L2 on the front surface Wa of the substrate W is also diffused from the central portion of the substrate W toward the periphery thereof by the centrifugal force generated by the rotation of the substrate W. Thereafter, if the processing liquid L2 on the front surface Wa of the substrate W is scattered off a peripheral portion of the substrate W, the drying of the substrate W is completed. Through the above-described processes, the liquid processing of the substrate W is completed.

[Effects]

According to the above-described exemplary embodiment, the cooling gas G1 jetted from the nozzle 43c is diffused over a wide range of the region of the front surface Wa of the substrate W including at least the central portion thereof. Thus, vaporization of the processing liquid L1 on the front surface Wa of the substrate W is accelerated, and, particularly, the central portion of the substrate W is cooled by heat of the vaporization. Accordingly, a temperature difference between the central portion and the peripheral portion of the substrate W may be hardly generated, so that a temperature distribution within the surface of the substrate W can be controlled more uniformly.

According to the above-described exemplary embodiment, since the cooling gas G1 jetted from the nozzle 43c is diffused over the wide range, an impact of the cooling gas G1 upon the processing liquid L1 is extremely small when the cooling gas G1 reaches the processing liquid L1 on the substrate W. Therefore, rippling of the processing liquid L1 on the substrate W or collapse of a form of the processing liquid L1 can be suppressed.

According to the above-described exemplary embodiment, the nozzle 43c may include the leading end portion which is provided with the multiple discharge openings and has the hemispherical shape. In this case, the cooling gas G1 can be easily jetted from the nozzle 43c over a wide range in a uniform manner. Therefore, the region of the substrate W onto which the cooling gas G1 is jetted can be cooled more uniformly.

According to the above-described exemplary embodiment, the jetting of the cooling gas G1 onto the processing liquid L1 may be continued in the developing period for the resist film R. In this case, the jetting of the cooling gas G1 from the nozzle 43c may be performed between the supply of the processing liquid L1 onto the substrate W and the supply of the processing liquid L2 onto the substrate W.

Thus, the respective supplying processings are not impeded by the nozzle 43c. Therefore, the series of liquid processings can be carried out smoothly.

According to the above-described exemplary embodiment, the exhaust amount from the cup main body 51 in the process S14 may be set to be smaller than the exhaust amounts from the cup main body 51 in the processes S15 and S16. In this case, a temperature decrease on the peripheral portion of the substrate W is suppressed when the cooling gas G1 is jetted from the nozzle 43c. Therefore, the temperature distribution within the surface of the substrate W can be controlled more uniformly.

According to the above-described exemplary embodiment, the nozzles 43b to 43d are held by the same nozzle head 43a. Thus, the nozzle unit 43 can be made compact.

MODIFICATION EXAMPLES

It should be noted that the above-described exemplary embodiment is illustrative in all aspects and is not anyway limiting. The above-described exemplary embodiment may be omitted, replaced and modified in various ways without departing from the scope and the spirit of claims.

Figure 11A:
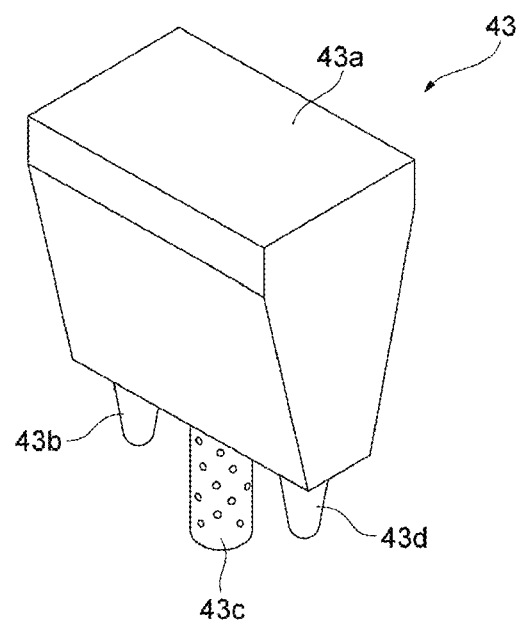
FIG. 11A and FIG. 11B are side views illustrating another example of the nozzle unit.
Figure 11B:
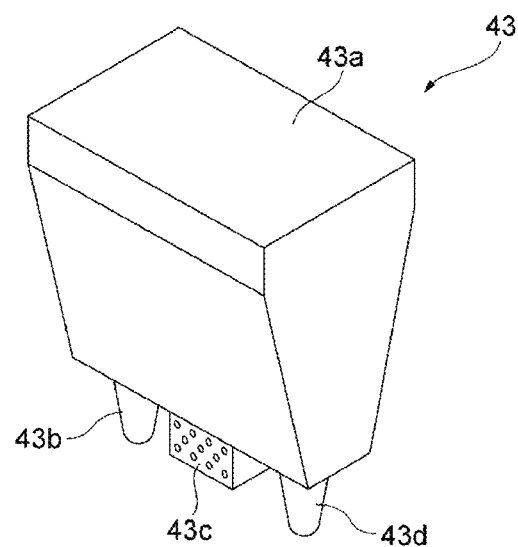

(1) The nozzle 43c may have a shape other than the hemispherical shape. By way of example, the nozzle 43c may have a cylinder shape, as shown in FIG. 11A. Alternatively, the nozzle 43c may have a prism shape, as illustrated in FIG. 11B. Further, though not shown, the nozzle 43c have a flat surface or a curved surface provided with a multiple number of discharge holes.

(2) The multiple discharge openings of the nozzle 43c may be formed in an entire peripheral surface(s) of the nozzle 43c. Alternatively, angles of the multiple discharge openings, positions of the multiple discharge openings on the peripheral surface(s) of the nozzle 43c, and so forth may be set lest the jetted cooling gas G1 should come into contact with the two nozzles 43b and 43d located next to the nozzle 43c.

(3) Opening areas of the multiple discharge openings of the nozzle 43c may be set such that flow velocities of the cooling gas G1 jetted from the respective discharge openings may become substantially same when the cooling gas G1 reaches the front surface Wa of the substrate W (top surface of the processing liquid L1). By way of example, the multiple discharge openings may be formed at the nozzle 43c such that the opening areas of the discharge openings are enlarged as they go from a leading end (lower end) of the nozzle 43c toward a base end thereof. Alternatively, to achieve the same effect, the multiple discharge openings may be formed at the nozzle 43c so that the number of the discharge openings increases as they go from the leading end (lower end) of the nozzle 43c toward the base end thereof.

Figure 12A:
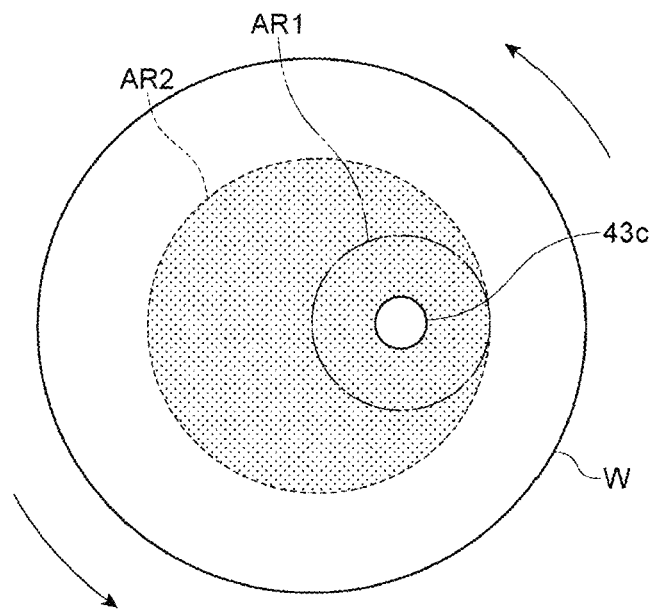
FIG. 12A and FIG. 12B are side views illustrating another example of an operation of the nozzle unit.

(4) In the process S14, the nozzle 43c may be located at a position deviated from a rotation center of the substrate W, as illustrated in FIG. 12A, when viewed from a vertical direction. In this case, though a jetting range AR1 of the cooling gas G1 jetted from the nozzle 43c is also deviated from the rotation center of the substrate W, the cooling gas G1 is diffused to a wider range AR2 of the substrate W as the substrate W is rotated. Therefore, the temperature distribution within the surface of the substrate W can be controlled more uniformly.

Figure 12B:
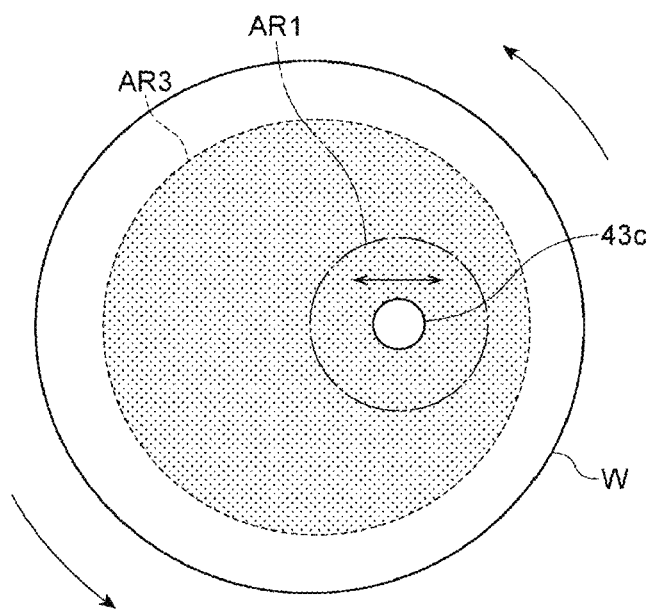
Figure 13A:
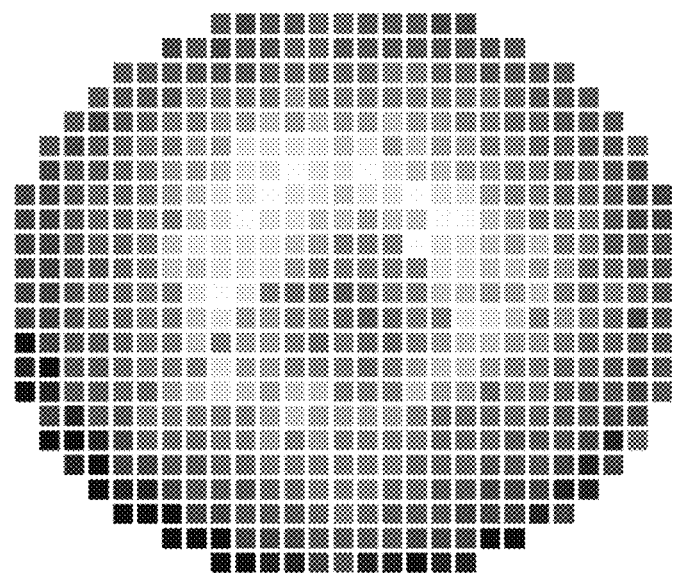
FIG. 13A and FIG. 13B are diagrams illustrating in-surface line width distributions of resist patterns formed on a surface of the substrate.
Figure 13B:
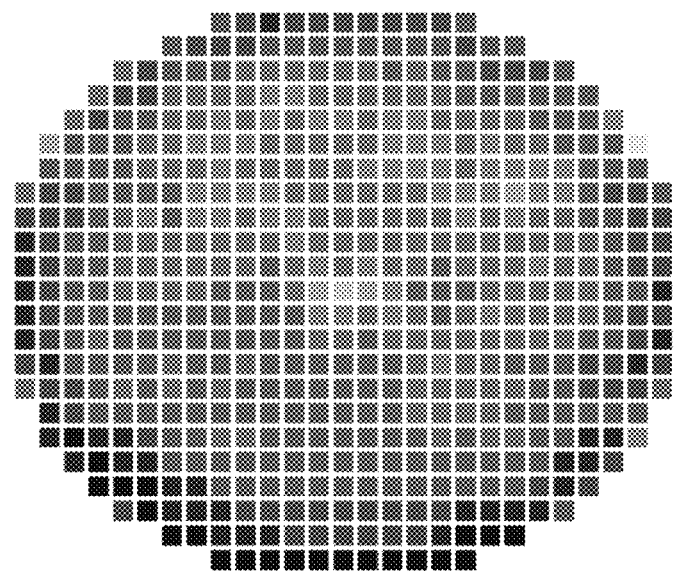
Figure 14A:
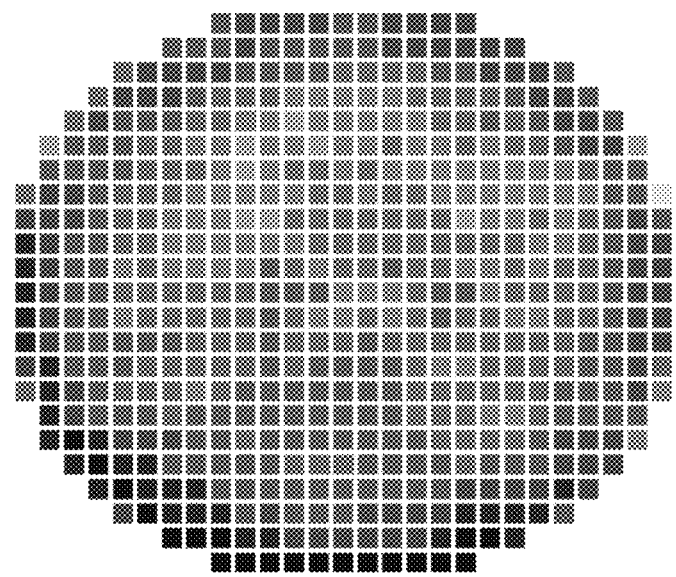
FIG. 14A and FIG. 14B are diagrams illustrating in-surface line width distributions of resist patterns formed on a surface of the substrate.
Figure 14B:
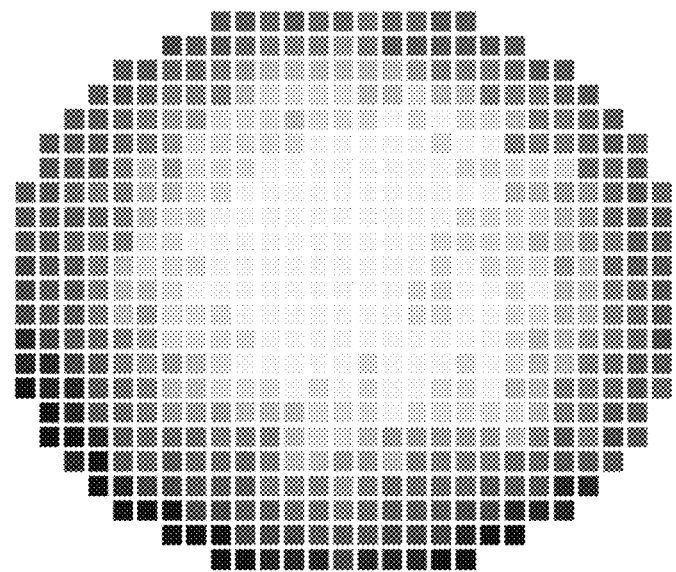

(5) In the process S14, the nozzle 43c may be located at the position deviated from the rotation center of the substrate W, as illustrated in FIG. 12B, when viewed from the vertical direction, and, also, the nozzle 43c may be moved horizontally. In this case, the cooling gas G1 is diffused to an even wider range AR3 of the substrate W by the horizontal movement of the nozzle 43c in addition to the rotation of the substrate W. Therefore, the temperature distribution within the surface of the substrate W can be controlled more uniformly.

(6) In the process S14, the controller Ctr may control the supply 40 to supply the cooling gas G1 to the central portion of the front surface Wa of the substrate W for a time period longer than a time period during which the cooling gas G1 is supplied to the peripheral portion of the front surface Wa of the substrate W. In this case, cooling of the central portion of the substrate W is further accelerated. Therefore, the temperature distribution within the surface of the substrate W can be controlled more uniformly.

(7) In the process S14, the controller Ctr may control the supply 40 to supply the cooling gas G1 only to the central portion of the front surface Wa of the substrate W without supplying the cooling gas G1 to the peripheral portion of the front surface Wa of the substrate W. The peripheral portion of the front surface Wa of the substrate W to which the cooling gas G1 is not supplied may be in a range of, e.g., about 3 cm to about 5 cm from an edge of the substrate W. In this case, the cooling of the central portion of the substrate W is further accelerated. Therefore, the temperature distribution within the surface of the substrate W can be controlled further uniformly.

(8) The supply of the drying gas G2 in the process S16 may not be performed. In this case, the substrate W may be dried by scattering the processing liquid L2 off the front surface Wa of the substrate W by the centrifugal force generated as the substrate W is rotated.

(9) Two of the nozzles 43b to 43d may be held by the nozzle head 43a, whereas the rest nozzle may be configured as a separate body from the nozzle head 43a. Alternatively, the nozzles 43b to 43d may be all configured as separate bodies.

(10) When the nozzles 43b and 43c are held by the nozzle head 43a, the processing of supplying the processing liquid L2 from the nozzle 43b and the processing of supplying the cooling gas G1 from the nozzle 43c may be performed in the state that a height of the nozzle head 43a is maintained constant. When the nozzles 43c and 43d are held by the nozzle head 43a, the processing of supplying the cooling gas G1 from the nozzle 43c and the processing of supplying the drying gas G2 from the nozzle 43d may be performed in the state that the height of the nozzle head 43a is maintained constant. Further, when the nozzles 43b to 43d are all held by the nozzle head 43a, the processing of supplying the processing liquid L2 from the nozzle 43b, the processing of supplying the cooling gas G1 from the nozzle 43c and the processing of supplying the drying gas G2 from the nozzle 43d may be performed in the state that the height of the nozzle head 43a is maintained constant. In these cases, the aforementioned series of processings are performed without moving the respective nozzles up and down. Thus, since a motion of the nozzles is simplified, efficiency of the liquid processing can be improved.

OTHER EXAMPLES

Example 1

An example of a liquid processing apparatus includes a substrate holder configured to hold a substrate; a processing liquid supply configured to supply a processing liquid onto a front surface of the substrate; a gas supply configured to supply a gas onto the front surface of the substrate; and a controller. The gas supply includes a diffusion nozzle which is provided with multiple discharge openings respectively elongated at different angles with respect to the front surface of the substrate. The controller performs controlling the gas supply to jet the gas from the diffusion nozzle onto a region of the front surface of the substrate including at least a central portion thereof in a state that the processing liquid is supplied on the front surface of the substrate. In this case, the gas jetted from the diffusion nozzle is diffused over a wide range of the region of the front surface of the substrate including at least the central portion thereof. As a result, vaporization of the processing liquid on the front surface of the substrate is accelerated, and, particularly, the central portion of the substrate is cooled by heat of the vaporization. Therefore, a temperature difference between the central portion and a peripheral portion of the substrate may be hardly caused, so that a temperature distribution within the surface of the substrate can be controlled more uniformly. Further, in this case, since the gas jetted from the diffusion nozzle is diffused over the wide range, an impact of the gas upon the processing liquid is extremely small when the gas reaches the processing liquid on the substrate. Therefore, rippling of the processing liquid on the substrate or collapse of a form of the processing liquid can be suppressed.

Example 2

In the apparatus of the example 1, the diffusion nozzle may have a leading end portion which is provided with the multiple discharge openings and is of a hemispherical shape. In this case, the gas can be easily jetted from the diffusion nozzle over the wide range in the uniform manner. Therefore, the region of the substrate onto which the gas is jetted can be cooled more uniformly.

Example 3

In the apparatus of the example 1 or 2, the controller may perform controlling the gas supply to jet the gas onto the front surface of the substrate from the diffusion nozzle in the state that the processing liquid is supplied on the front surface of the substrate, while controlling the gas supply to supply the gas onto the central portion of the front surface of the substrate for a time period longer than a time period during which the gas is supplied onto a peripheral portion of the front surface of the substrate. In this case, cooling of the central portion of the substrate is more accelerated. Therefore, the temperature distribution within the surface of the substrate can be controlled more uniformly.

Example 4

In the apparatus of the example 3, the controller may perform controlling the gas supply to jet the gas from the diffusion nozzle onto the central portion of the front surface of the substrate in the state that the processing liquid is supplied on the front surface of the substrate, and, also, controlling the gas supply not to jet the gas from the diffusion nozzle onto the peripheral portion of the front surface of the substrate. In this case, the cooling of the central portion of the substrate is further accelerated. Therefore, the temperature distribution within the surface of the substrate can be controlled further uniformly.

Example 5

In the apparatus of any one of the examples 1 to 4, the controller may perform controlling the gas supply to jet the gas from the diffusion nozzle onto the region of the front surface of the substrate including at least the central portion thereof in the state that the processing liquid is supplied on the front surface of the substrate and in a state that the diffusion nozzle is deviated from a rotation center of the substrate when viewed from a vertical direction. In this case, the gas from the diffusion nozzle can be diffused to the wider range of the substrate as the substrate is rotated while the gas is being jetted from the diffusion nozzle. Therefore, the temperature distribution within the surface of the substrate can be controlled more uniformly.

Example 6

The apparatus of the examples 1 to 6 may further include a cleaning liquid supply configured to supply a cleaning liquid onto the front surface of the substrate. The controller may perform controlling the cleaning liquid supply to supply the cleaning liquid onto the front surface of the substrate after the controlling of the gas supply. In this case, the jetting of the gas from the diffusion nozzle is performed between the supply of the processing liquid and the supply of the cleaning liquid onto the substrate. Accordingly, the respective supplying processings are not impeded by the diffusion nozzle. Therefore, the series of liquid processings can be performed smoothly.

Example 7

The apparatus of the example 6 may further include an exhaust device configured to exhaust an atmosphere around the substrate held by the substrate holder. The controller may perform controlling the exhaust device such that an exhaust amount in the controlling of the gas supply becomes smaller than an exhaust amount in the controlling of the cleaning liquid supply. In this case, when the gas is jetted from the diffusion nozzle, the temperature decrease on the peripheral portion of the substrate is suppressed. Therefore, the temperature distribution within the surface of the substrate can be controlled more uniformly.

Example 8

In the apparatus of example 6 or 7, a nozzle of the cleaning liquid supply may be configured to be moved as one body with the diffusion nozzle. The controller may perform, while maintaining height positions of the diffusion nozzle and the nozzle of the cleaning liquid supply constant, controlling the gas supply such that exposure of the front surface of the substrate in the state that the processing liquid is supplied thereon, which is caused by jetting the gas from the diffusion nozzle, is suppressed and controlling the cleaning liquid supply to drain the processing liquid supplied on the front surface of the substrate. In this case, since the two nozzles are held by the single nozzle head, the apparatus can be made compact. Further, since the aforementioned series of processings are performed without moving the nozzles up and down, the motion of the nozzles is simplified, so that the efficiency of the liquid processing can be improved. Furthermore, since the front surface of the substrate is not exposed by the jetting of the gas from the diffusion nozzle, the impact of the gas upon the processing liquid is more reduced when the gas reaches the processing liquid on the substrate. Therefore, the rippling of the processing liquid on the substrate or the collapse of the form of the processing liquid can be further suppressed.

Example 9

The apparatus of the example 7 or 8 may further include a drying gas supply configured to supply a drying gas onto the front surface of the substrate; and a nozzle head configured to hold the diffusion nozzle and a nozzle of the drying gas supply. The controller may further perform, after the controlling of the cleaning liquid supply, controlling the drying gas supply to jet the drying gas onto the front surface of the substrate to remove the cleaning liquid from the front surface of the substrate. In this case, since the two nozzles are held by the single nozzle head, the apparatus can be made compact.

Example 10

In the apparatus of any one of the examples 7 to 9, the controller may perform the controlling of the gas supply, the controlling of the cleaning liquid supply and the controlling of the drying gas supply in a state that height positions of the diffusion nozzle, the nozzle of the cleaning liquid supply and the nozzle of the drying gas supply are maintained constant. In this case, the aforementioned series of processings are performed without moving the nozzles up and down. Therefore, the motion of the nozzles is simplified, so that the efficiency of the liquid processing can be improved.

Example 11

In an example of a liquid processing method includes supplying a processing liquid onto a front surface of a substrate; and jetting a gas from a diffusion nozzle, which is provided with multiple discharge openings respectively elongated at different angles with respect to the front surface of the substrate, onto a region of the front surface of the substrate including at least a central portion thereof in a state that the processing liquid is supplied on the front surface of the substrate. In this case, the same effect as obtained in the apparatus of the example 1 can be achieved.

Example 12

In the method of the example 11, the diffusion nozzle may have a leading end portion which is provided with the multiple discharge openings and is of a hemispherical shape. In this case, the same effect as obtained in the apparatus of the example 2 can be achieved.

Example 13

In the method of the example 11 or 12, the jetting of the gas may include jetting the gas onto the front surface of the substrate from the diffusion nozzle in the state that the processing liquid is supplied on the front surface of the substrate, while controlling the gas to be supplied onto the central portion of the front surface of the substrate for a time period longer than a time period during which the gas is supplied onto a peripheral portion of the front surface of the substrate. In this case, the same effect as obtained in the apparatus of the example 3 can be achieved.

Example 14

In the method of the example 13, the jetting of the gas may include jetting the gas from the diffusion nozzle onto the central portion of the front surface of the substrate in the state that the processing liquid is supplied on the front surface of the substrate, and, also, not jetting the gas from the diffusion nozzle onto the peripheral portion of the front surface of the substrate. In this case, the same effect as obtained in the apparatus of the example 4 can be achieved.

Example 15

In the method of any one of the examples 11 to 14, the jetting of the gas may include jetting the gas from the diffusion nozzle onto the region of the front surface of the substrate including at least the central portion thereof in the state that the processing liquid is supplied on the front surface of the substrate and in a state that the diffusion nozzle is deviated from a rotation center of the substrate when viewed from a vertical direction. In this case, the same effect as obtained in the apparatus of the example 5 can be achieved.

Example 16

The method of any one of examples 11 to 15 may further include supplying a cleaning liquid onto the front surface of the substrate after the jetting of the gas. In this case, the same effect as obtained in the apparatus of the example 6 can be achieved.

Example 17

In the method of example 16, an exhaust amount from an atmosphere around the substrate in the jetting of the gas may be smaller than an exhaust amount from the atmosphere around the substrate in the supplying of the cleaning liquid. In this case, the same effect as obtained in the apparatus of the example 7 can be achieved.

Example 18

The method of the example 16 or 17 may further include jetting a drying gas onto the front surface of the substrate after the supplying of the cleaning liquid, to thereby remove the cleaning liquid from the front surface of the substrate. The diffusion nozzle and a nozzle for the jetting of the drying gas may be held by a single nozzle head. In this case, the same effect as obtained in the apparatus of the example 9 can be achieved.

Example 19

In the method of any one of the examples 16 to 18, the jetting of the gas, the supplying of the cleaning liquid and the jetting of the drying gas may be performed in a state that height positions of the diffusion nozzle, a nozzle for the supplying of the cleaning liquid and the nozzle for the jetting of the drying gas are maintained constant. In this case, the same effect as obtained in the apparatus of the example 10 can be achieved.

Example 20

A computer-readable recording medium may store thereon computer-executable instructions that, in response to execution, cause a liquid processing apparatus to perform the method of the examples 11 to 19. In this case, the same effect as obtained in the apparatus of the example 1 can be achieved. In the present specification, the computer-readable recording medium may include a non-transitory computer recording medium (for example, various kinds of main or auxiliary storage devices), or a transitory computer recording medium (for example, a data signal which can be provided through a network).

EXPERIMENTAL EXAMPLES

Below, experimental examples 1 to 3 and a comparative example will be explained. Here, however, it should be noted that these examples do not limit any of the examples disclosed in the present exemplary embodiment.

Experimental Example 1

In the experimental example 1, a resist pattern RP is formed on a front surface Wa of a substrate W having a diameter of 300 mm through the processes S11 to S16 by using the above-described substrate processing system 1. At this time, in the process S14, the cooling gas G1 is supplied onto the front surface Wa of the substrate W for 40 seconds without rotating the substrate W in the state that the nozzle 43c is located above a rotation center of the substrate W when viewed from a vertical direction.

Experimental Example 2

In the experimental example 2, a resist pattern RP is formed on a front surface Wa of a substrate W having a diameter of 300 mm through the processes S11 to S16 by using the above-described substrate processing system 1. At this time, in the process S14, the cooling gas G1 is supplied onto the front surface Wa of the substrate W for 40 seconds in the state that the nozzle 43c is located at a position deviated 50 mm from a rotation center of the substrate W when viewed from the vertical direction and the substrate W is being rotated at 10 rpm.

Experimental Example 3

In the experimental example 3, a resist pattern RP is formed on a front surface Wa of a substrate W having a diameter of 300 mm through the processes S11 to S16 by using the above-described substrate processing system 1. At this time, in the process S14, the cooling gas G1 is supplied onto the front surface Wa of the substrate W for 40 seconds in the state that the nozzle 43c is horizontally moved back and forth three times in a range of 0 mm to 100 mm from a rotation center of the substrate W and the substrate W is being rotated at 10 rpm.

Comparative Example

In the comparative example, a resist pattern RP is formed on a front surface Wa of a substrate W having a diameter of 300 mm by using the above-described substrate processing system 1 through the processes S11 to S13 and the processes S15 to S16. That is, the cooling gas G1 is not supplied from the nozzle 43c onto the front surface Wa of the substrate W.

(Results)

A temperature difference between a maximum temperature and a minimum temperature within the surface of the substrate W are measured upon a lapse of 55 seconds after the processing liquid L1 is supplied onto the front surface Wa of the substrate W, that is, from the beginning of the process S13. As a result, the temperature difference in the experimental example 1 is found to be 1.03° C. The temperature difference in the experimental example 2 is found to be 0.49° C. The temperature difference in the experimental example 3 is found to be 0.52° C. The temperature difference in the comparative example is found to be 1.13° C. Thus, it is found out that a temperature distribution within the surface of the substrate W is more uniform in the experimental examples 1 to 3, as compared to the comparative example.

Figure 15:
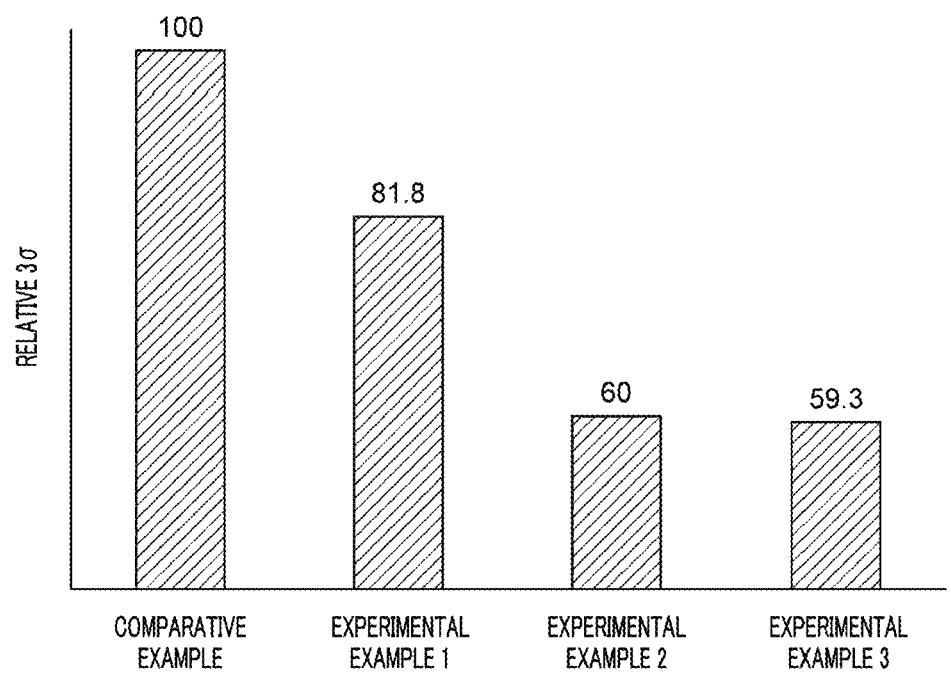
FIG. 15 is a graph showing non-uniformity (relative 3σ) in the in-surface line width distribution in each of the experimental examples 1 to 3 and the comparative example.

For each of the experimental examples 1 to 3 and the comparative example, an in-surface distribution of a line width of the resist pattern RP formed on the front surface Wa of the substrate W is measured. FIG. 13A to FIG. 14B show results thereof. Further, for each of the experimental examples 1 to 3 and the comparative example, non-uniformity (3σ) of the in-surface line width distribution is calculated. FIG. 15 shows 3σ values (relative 3σ) of the experimental examples 1 to 3 when a 3σ value of the comparative example is defined as 100.

As can be seen from FIG. 13A to FIG. 15, the in-surface line width distribution is more uniform in the experimental examples 1 to 3, as compared to the comparative example. Particularly, in the experimental example 2, uniformity of the in-surface line width distribution is found to be improved by 40.0%, as compared to the comparative example. In the experimental example 3, the uniformity of the in-surface line width distribution is found to be improved by 40.6%, as compared to the comparative example.

According to the liquid processing apparatus, the liquid processing method and the computer-readable recording medium of the present disclosure, the temperature distribution within the surface of the substrate can be controlled more uniformly.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. A liquid processing apparatus, comprising: a substrate holder configured to hold a substrate; a processing liquid supply configured to supply a processing liquid onto a front surface of the substrate, the processing liquid supply comprising a processing liquid supply nozzle; a gas supply configured to supply a gas onto the front surface of the substrate; and a controller, wherein the gas supply comprises a diffusion nozzle which is different from the processing liquid supply nozzle and provided with multiple discharge openings respectively elongated at different angles with respect to the front surface of the substrate, and the controller performs controlling the gas supply to jet the gas from the diffusion nozzle onto a top surface of the processing liquid and above a region of the front surface of the substrate including at least a central portion thereof in a state that the processing liquid has been supplied on the front surface of the substrate, and controlling the processing liquid supply and the gas supply not to perform the supplying of the processing liquid and the jetting of a gas at the same time, wherein the diffusion nozzle has a leading end portion which is provided with the multiple discharge openings and is of a hemispherical shape.

2. The liquid processing apparatus of claim 1,
wherein the controller performs controlling the gas supply to jet the gas onto the front surface of the substrate from the diffusion nozzle in the state that the processing liquid has been supplied on the front surface of the substrate, while controlling the gas supply to supply the gas above the central portion of the front surface of the substrate for a time period longer than a time period during which the gas is being supplied above a peripheral portion of the front surface of the substrate, and cool the processing liquid at the central portion of the front surface of the substrate.

3. The liquid processing apparatus of claim 1,
wherein the controller performs controlling the gas supply to jet the gas from the diffusion nozzle above the central portion of the front surface of the substrate in the state that the processing liquid has been supplied on the front surface of the substrate, and, also, controlling the gas supply not to jet the gas from the diffusion nozzle above a peripheral portion of the front surface of the substrate, and cool the processing liquid at the central portion of the front surface of the substrate.

4. The liquid processing apparatus of claim 1,
wherein the controller performs controlling the gas supply to jet the gas from the diffusion nozzle onto the region of the front surface of the substrate including at least the central portion thereof in the state that the processing liquid is supplied on the front surface of the substrate and in a state that the diffusion nozzle is deviated from a rotation center of the substrate when viewed from a vertical direction.

5. The liquid processing apparatus of claim 1, further comprising:
a cleaning liquid supply including a nozzle configured to supply a cleaning liquid onto the front surface of the substrate,
wherein the controller performs controlling the cleaning liquid supply to supply the cleaning liquid onto the front surface of the substrate after the controlling of the gas supply.

6. The liquid processing apparatus of claim 5, further comprising:
an exhaust device configured to exhaust an atmosphere around the substrate held by the substrate holder,
wherein the controller performs controlling the exhaust device such that a degree of an exhaust flow exhausted through an exhaust port during the controlling of the gas supply becomes smaller than an exhaust flow during the controlling of the cleaning liquid supply,
wherein the controller performs controlling the gas supply to jet the gas onto the top surface of the processing liquid supplied onto the front surface of the substrate without supplying the processing liquid onto a same position as the gas, and cool the processing liquid.

7. The liquid processing apparatus of claim 5,
wherein the nozzle of the cleaning liquid supply is configured to be moved as one body with the diffusion nozzle, and
the controller performs, while maintaining height positions of the diffusion nozzle and the nozzle of the cleaning liquid supply constant, controlling the gas supply such that the front surface of the substrate in the state that the processing liquid is supplied thereon, which is caused by jetting the gas from the diffusion nozzle, is not exposed and controlling the cleaning liquid supply to drain the processing liquid supplied on the front surface of the substrate.

8. The liquid processing apparatus of claim 5, further comprising:
a drying gas supply including a nozzle configured to supply a drying gas onto the front surface of the substrate; and
a nozzle head configured to hold the diffusion nozzle and the nozzle of the drying gas supply,
wherein the controller further performs, after the controlling of the cleaning liquid supply, controlling the drying gas supply to jet the drying gas onto the front surface of the substrate to remove the cleaning liquid from the front surface of the substrate.

9. The liquid processing apparatus of claim 8,
wherein the controller performs the controlling of the gas supply, the controlling of the cleaning liquid supply and the controlling of the drying gas supply in a state that height positions of the diffusion nozzle, the nozzle of the cleaning liquid supply and the nozzle of the drying gas supply are maintained constant.

10. A liquid processing method, comprising: supplying a processing liquid from a processing liquid supply nozzle onto a front surface of a substrate; and jetting a gas from a diffusion nozzle, which is different from the processing liquid supply nozzle and provided with multiple discharge openings respectively elongated at different angles with respect to the front surface of the substrate, onto a top surface of the processing liquid and above a region of the front surface of the substrate including at least a central portion thereof in a state that the processing liquid has been supplied on the front surface of the substrate, wherein the supplying of the processing liquid and the jetting of a gas are not performed at the same time, wherein the diffusion nozzle has a leading end portion which is provided with the multiple discharge openings and is of a hemispherical shape.

11. The liquid processing method of claim 10,
wherein the jetting of the gas comprises:
jetting the gas onto the front surface of the substrate from the diffusion nozzle in the state that the processing liquid has been supplied on the front surface of the substrate, while controlling the gas to be supplied above the central portion of the front surface of the substrate for a time period longer than a time period during which the gas is being supplied above a peripheral portion of the front surface of the substrate; and
cooling the processing liquid at the central portion of the front surface of the substrate.

12. The liquid processing method of claim 10,
wherein the jetting of the gas comprises:
jetting the gas from the diffusion nozzle above the central portion of the front surface of the substrate in the state that the processing liquid has been supplied on the front surface of the substrate, and, also, not jetting the gas from the diffusion nozzle above a peripheral portion of the front surface of the substrate; and
cooling the processing liquid at the central portion of the front surface of the substrate.

13. The liquid processing method of claim 10,
wherein the jetting of the gas comprises jetting the gas from the diffusion nozzle onto the region of the front surface of the substrate including at least the central portion thereof in the state that the processing liquid is supplied on the front surface of the substrate and in a state that the diffusion nozzle is deviated from a rotation center of the substrate when viewed from a vertical direction.

14. The liquid processing method of claim 10, further comprising:
   supplying a cleaning liquid onto the front surface of the substrate after the jetting of the gas.

15. The liquid processing method of claim 14,
   wherein a degree of an exhaust flow exhausted through an exhaust port from an atmosphere around the substrate during the jetting of the gas is smaller than a degree of an exhaust flow from the atmosphere around the substrate during the supplying of the cleaning liquid,
   wherein the jetting of the gas comprises jetting the gas onto the top surface of the processing liquid supplied onto the front surface of the substrate without supplying the processing liquid onto a same position as the gas, and cooling the processing liquid.

16. The liquid processing method of claim 14, further comprising:
   jetting a drying gas onto the front surface of the substrate after the supplying of the cleaning liquid, to thereby remove the cleaning liquid from the front surface of the substrate,
   wherein the diffusion nozzle and a nozzle for the jetting of the drying gas are held by a single nozzle head.

17. The liquid processing method of claim 16,
   wherein the jetting of the gas, the supplying of the cleaning liquid and the jetting of the drying gas are performed in a state that height positions of the diffusion nozzle, a nozzle for the supplying of the cleaning liquid and the nozzle for the jetting of the drying gas are maintained constant.

18. The liquid processing method of claim 10, wherein the jetting of the gas comprises:

jetting the gas onto the top surface of the processing liquid supplied onto the front surface of the substrate; and cooling the processing liquid.

19. The liquid processing method of claim 18, wherein the jetting of the gas is performed such that the front surface of the substrate is not exposed by the gas.

* * * * *